United States Patent
Ishikawa et al.

(10) Patent No.: US 11,948,779 B2
(45) Date of Patent: Apr. 2, 2024

(54) COMPONENT FOR PLASMA PROCESSING APPARATUS AND PLASMA PROCESSING APPARATUS

(71) Applicant: KYOCERA Corporation, Kyoto (JP)

(72) Inventors: Kazuhiro Ishikawa, Shiga (JP); Takashi Hino, Yokohama (JP); Shuichi Saito, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 350 days.

(21) Appl. No.: 17/605,967

(22) PCT Filed: Apr. 20, 2020

(86) PCT No.: PCT/JP2020/017109
§ 371 (c)(1),
(2) Date: Oct. 22, 2021

(87) PCT Pub. No.: WO2020/218265
PCT Pub. Date: Oct. 29, 2020

(65) Prior Publication Data
US 2022/0181123 A1 Jun. 9, 2022

(30) Foreign Application Priority Data
Apr. 26, 2019 (JP) .................................. 2019-085665

(51) Int. Cl.
*H01J 37/32* (2006.01)
*C01F 17/218* (2020.01)
(Continued)

(52) U.S. Cl.
CPC ...... *H01J 37/32495* (2013.01); *C01F 17/218* (2020.01); *C23C 14/083* (2013.01);
(Continued)

(58) Field of Classification Search
CPC ..... C01F 17/218; C23C 14/083; C23C 14/34; H01J 37/32495
See application file for complete search history.

(56) References Cited

U.S. PATENT DOCUMENTS

2009/0233126 A1 * 9/2009 Iwasawa ................. C23C 24/04
428/702
2013/0277332 A1 10/2013 Aheem et al.
(Continued)

FOREIGN PATENT DOCUMENTS

JP         4532489 B2     8/2010
JP     2012-508467 A     4/2012
(Continued)

*Primary Examiner* — Zachary M Davis
(74) *Attorney, Agent, or Firm* — Procopio, Cory, Hargreaves & Savitch LLP (57) ABSTRACT

A component for a plasma processing apparatus, and a plasma processing apparatus are highly resistant to plasma and are highly durable. The component includes a substrate containing a first element that is a metal element or a semimetal element, and a film located on the substrate and containing yttrium oxide as a main constituent. The film contains yttrium oxide crystal grains oriented with a deviation angle of ±10° from a {111} direction of a crystal lattice plane of yttrium oxide. The yttrium oxide crystal grains oriented with the deviation angle have an area ratio of 45% or greater.

9 Claims, 6 Drawing Sheets (51) Int. Cl.
*C23C 14/08* (2006.01)
*C23C 14/34* (2006.01)

(52) U.S. Cl.
CPC .......... *C23C 14/34* (2013.01); *C01P 2002/02* (2013.01); *C01P 2002/60* (2013.01); *C01P 2002/74* (2013.01); *C01P 2002/90* (2013.01); *C01P 2006/90* (2013.01)

(56) References Cited

U.S. PATENT DOCUMENTS

| | | |
|---|---|---|
| 2018/0209042 A1 | 7/2018 | Wu et al. |
| 2020/0165715 A1 | 5/2020 | Hino et al. |

FOREIGN PATENT DOCUMENTS

| | | |
|---|---|---|
| JP | 2013-209252 A | 10/2013 |
| JP | 2018-188735 A | 11/2018 |
| WO | 2005/021830 A2 | 3/2005 |
| WO | 2010/054112 A2 | 5/2010 |
| WO | 2019/026818 A1 | 2/2019 |

* cited by examiner

COMPONENT FOR PLASMA PROCESSING APPARATUS AND PLASMA PROCESSING APPARATUS

FIELD

The present disclosure relates to a component for a plasma processing apparatus and to a plasma processing apparatus.

BACKGROUND

A known plasma processing apparatus includes components to have high resistance to plasma, including a substrate and a film of yttrium oxide deposited by thermal spraying.

Patent Literature 1 describes, as such a plasma processing apparatus component, a ceramic component including a substrate formed from alumina and a corrosion-resistant coating with an adhesion strength of about 15 MPa or greater directly deposited on the substrate.

CITATION LIST

Patent Literature

Patent Literature 1: Japanese Patent No. 4532489

BRIEF SUMMARY

Technical Problem

As described in Patent Literature 1, the above corrosion-resistant coating has an adhesion strength of up to 46 MPa, which may be insufficient for higher adhesion to the substrate intended recently.

When the ceramic component used in an environment with repeatedly rising and lowering temperatures, the corrosion-resistant coating formed by thermal spraying and having many internal pores and microcracks may fail to reduce particles.

Solution to Problem

A component for a plasma processing apparatus according to an aspect of the present disclosure includes a substrate containing a first element that is a metal element or a semimetal element, and a film located on the substrate and containing yttrium oxide as a main constituent. The film contains yttrium oxide crystal grains oriented with a deviation angle of ±10° or less from a {111} direction of a crystal lattice plane of yttrium oxide. The yttrium oxide crystal grains oriented with the deviation angle have an area ratio of 45% or greater.

A plasma processing apparatus according to another aspect of the present disclosure includes the component according to the above aspect of the present disclosure.

Advantageous Effects

The component for a plasma processing apparatus according to the above aspect is highly resistant to plasma and is highly durable.

The plasma processing apparatus according to the above aspect is highly durable and reliable.

BRIEF DESCRIPTION OF DRAWINGS

The objects, features, and advantages of the present invention will become more apparent from the following detailed description and the drawings.

DETAILED DESCRIPTION

A component for a plasma processing apparatus according to one or more embodiments of the present disclosure will now be described in detail with reference to the drawings.

Figure 1:
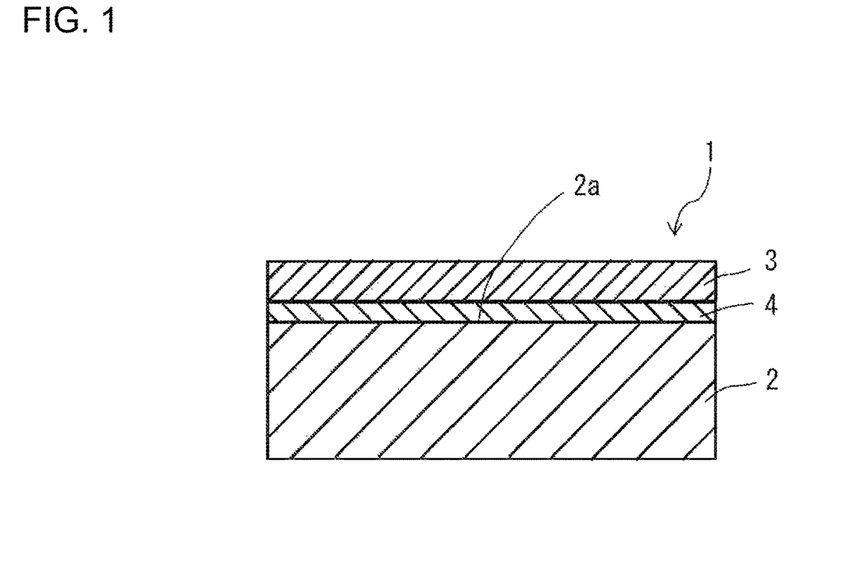
FIG. 1 is a schematic cross-sectional view of a component for a plasma processing apparatus according to an embodiment of the present disclosure.

As shown in FIG. 1, a component 1 for a plasma processing apparatus according to one or more embodiments of the present disclosure includes a substrate 2 containing a first element that is a metal or a semimetal element, and a film 3 located on the substrate 2 and containing yttrium oxide as a main constituent. The component 1 may include an amorphous section 4 between the substrate 2 and the film 3. The amorphous section 4 contains the first element, yttrium, and oxygen. The amorphous section 4 containing the first element and yttrium has higher covalent bonding to the substrate 2 and the film 3 and thus allows the film 3 to adhere to the substrate 2 with higher strength. The amorphous section 4, which is amorphous, is likely to undergo structure relaxation under repeatedly rising and lowering temperature, and thus maintains sufficiently high adhesion strength. For example, the film 3 with a thickness of 5 to 200 µm inclusive and the amorphous section 4 with a thickness of 2 to 4 nm inclusive can have an adhesion strength of 60 MPa or greater. The adhesion strength may be measured with a thin-film adhesion strength tester (Sebastian V-A, Quad Group Inc.) after a stud pin is fixed (for pulling off the film 3) on the surface of the film 3 using an epoxy resin.

Semimetal elements herein refer to elements with properties between those of metal elements and nonmetal elements, and include six elements, or boron, silicon, germanium, arsenic, antimony, and tellurium.

The substrate 2 may be formed from, for example, quartz, aluminum having a purity of 99.999% (5N) or greater, aluminum alloys such as an aluminum 6061 alloy, an aluminum nitride ceramic material, an aluminum oxide ceramic material, or a silicon carbide ceramic material. An aluminum oxide ceramic material has an aluminum oxide content of 90% or greater by mass of the total mass (100%) of the elements contained in the substrate 2. The content of aluminum oxide is the value obtained by converting Al to $Al_2O_3$. The same applies to an aluminum nitride ceramic material. The aluminum oxide ceramic material may contain magnesium oxide, calcium oxide, silicon oxide, and other elements, in addition to aluminum oxide. A silicon carbide ceramic material may contain boron, carbon, and other elements, in addition to silicon carbide.

Aluminum with a purity of 99.999% (5N) or greater, aluminum alloys such as an aluminum 6061 alloy, and an aluminum nitride ceramic material all contain iron, copper, and silicon as unavoidable impurities.

The main constituent herein refers to an element that constitutes 90% or greater by mass of the total mass (100%) of the elements contained in the film 3.

FIG. 1 shows the film 3 and the amorphous section 4 clearly for ease of explanation, but does not show the exact correlation between the thicknesses of the substrate 2, the film 3, and the amorphous section 4.

The compositional formula of yttrium oxide is, for example, $Y_2O_{3-x}$ (0≤x≤1).

The film 3 may contain, in addition to yttrium oxide, other elements such as fluorine (F), sodium (Na), magnesium (Mg), aluminum (Al), silicon (Si), phosphorus (P), sulfur (S), chlorine (Cl), potassium (K), calcium (Ca), titanium (Ti), chromium (Cr), manganese (Mn), iron (Fe), cobalt (Co), nickel (Ni), copper (Cu), zinc (Zn), and strontium (Sr), depending on the purity of a target used to form the film 3 and the configuration of a device used. The elements contained in the film 3 may be identified with a thin film X-ray diffractometer.

To identify the amorphous section 4 to be amorphous, a sample is first prepared from the component 1 for a plasma processing apparatus according to one or more embodiments of the present disclosure with a focused ion beam (FIB) method. The sample may be partly observed with an atomic resolution analytical electron microscope (e.g., JEM-ARM200F or its successor, JEOL Ltd.). The sample may be identified as amorphous based on an electron diffraction pattern obtained at an acceleration voltage of 200 kV using a fast Fourier transform (FFT).

The amorphous section 4 may have the highest content of yttrium by mass. The amorphous section 4 is thus stable in a high-temperature environment and is less likely to react with the conductive silicon contained in the substrate 2. This reduces the possibility of causing a leakage current. The amorphous section 4 may have, for example, an yttrium content of 42% or greater by mass of the total mass (100%) of the elements contained in the amorphous section 4. The resistance to plasma can be determined by measuring a decrease in the weight of the element after plasma processing. A less decrease in the weight represents a higher resistance to plasma. To determine the mass ratio of the elements contained in the amorphous section 4, the atomic ratio of the elements contained in the amorphous section 4 may be determined by energy dispersive X-ray analysis (EDX) of the amorphous section 4. The atomic ratio may then be converted to a mass ratio.

Figure 2:
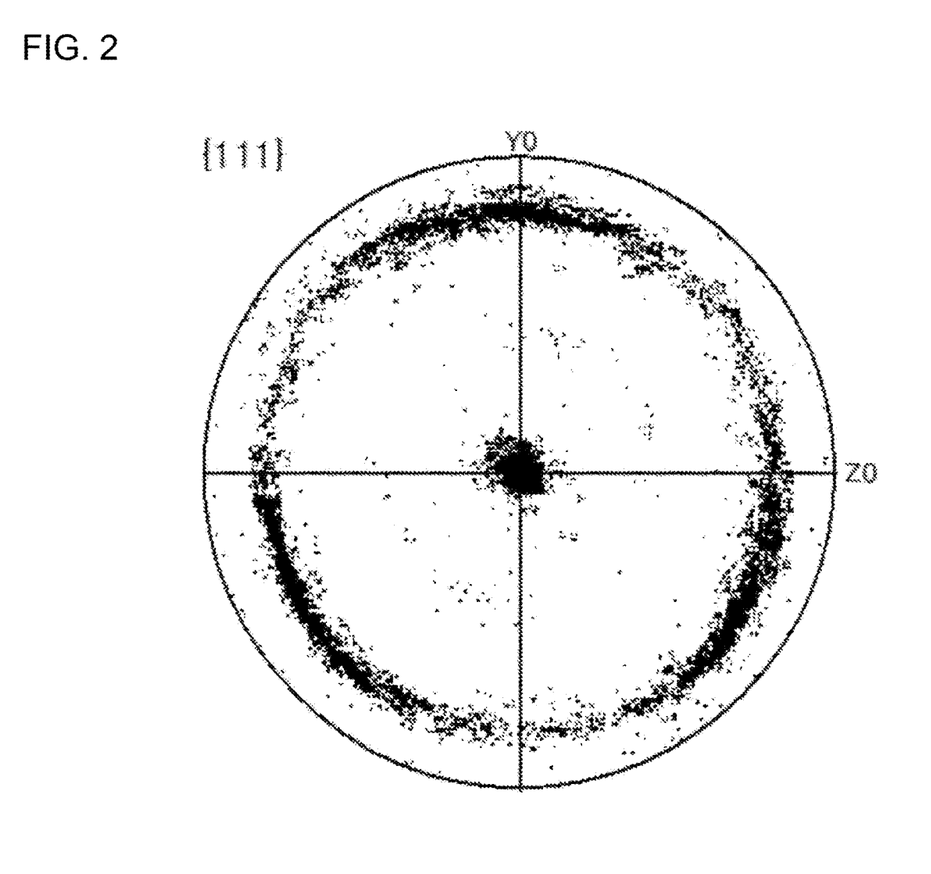
FIG. 2 is a pole figure showing the characteristics of a film included in the component for a plasma processing apparatus according to the embodiment of the present disclosure.
Figure 3:
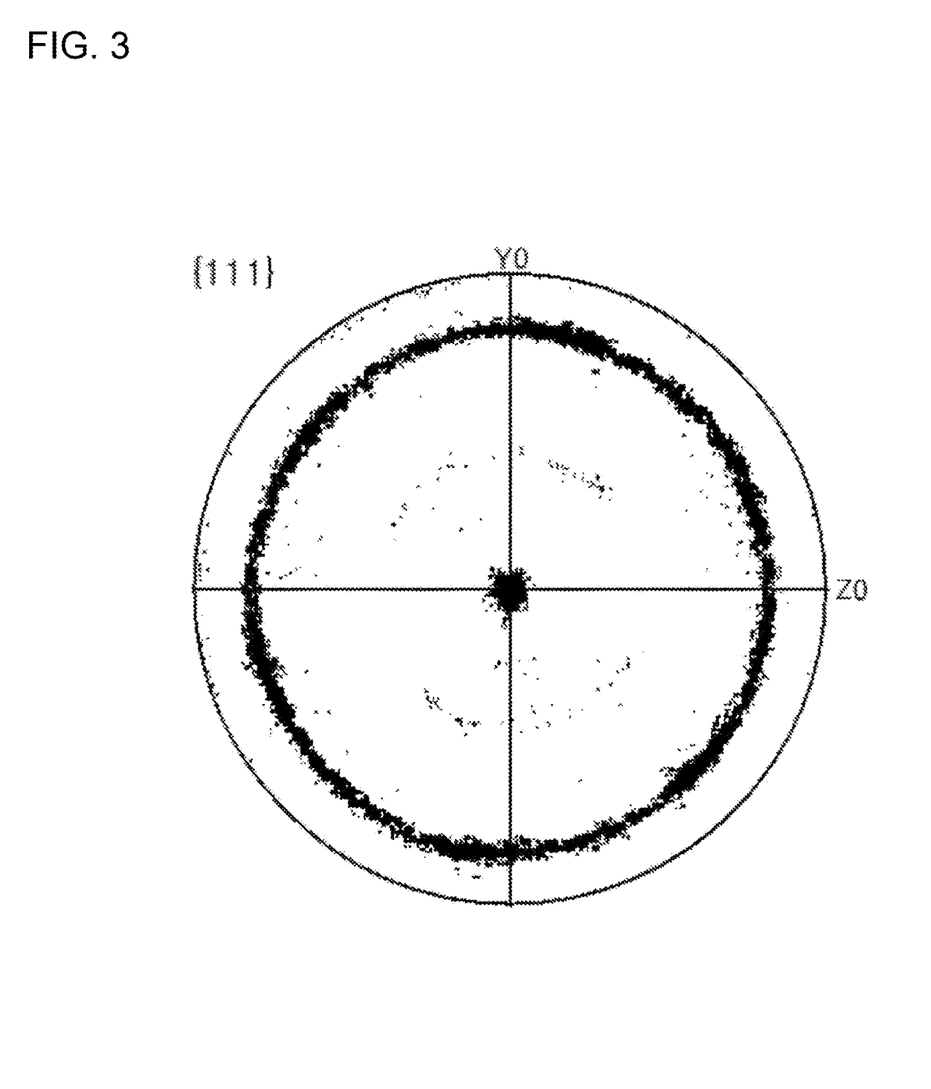
FIG. 3 is a pole figure showing the characteristics of the film included in the component for a plasma processing apparatus according to the embodiment of the present disclosure.
Figure 4:
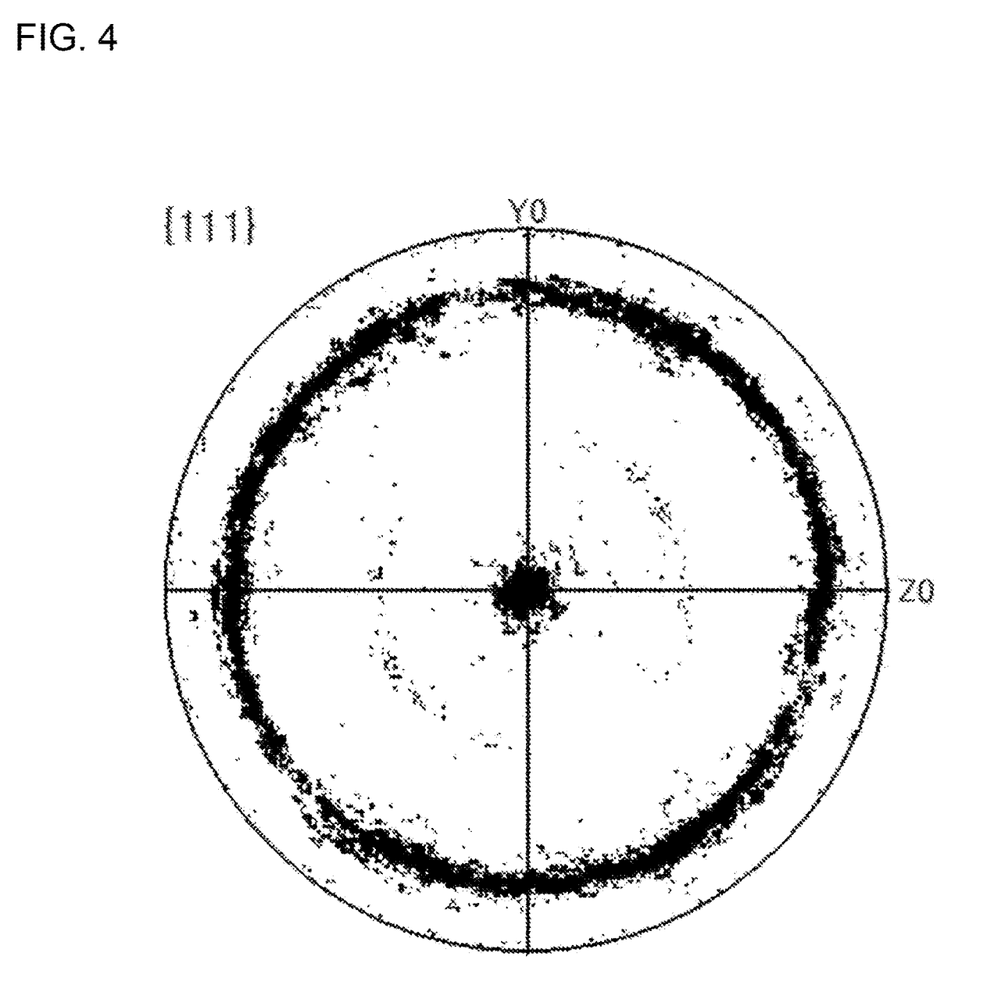
FIG. 4 is a pole figure showing the characteristics of the film included in the component for a plasma processing apparatus according to the embodiment of the present disclosure.
Figure 5:
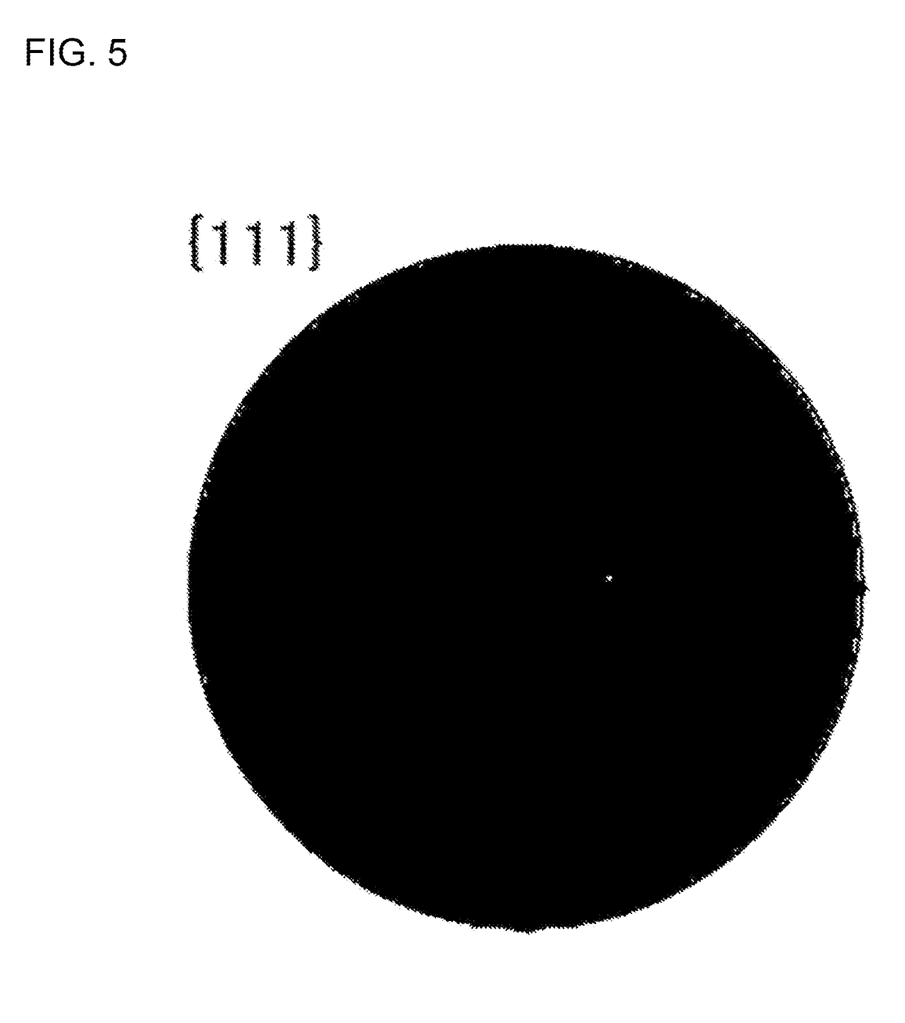
FIG. 5 is a pole figure showing the characteristics of a film included in a component for a plasma processing apparatus according to a comparative example.
Figure 6:
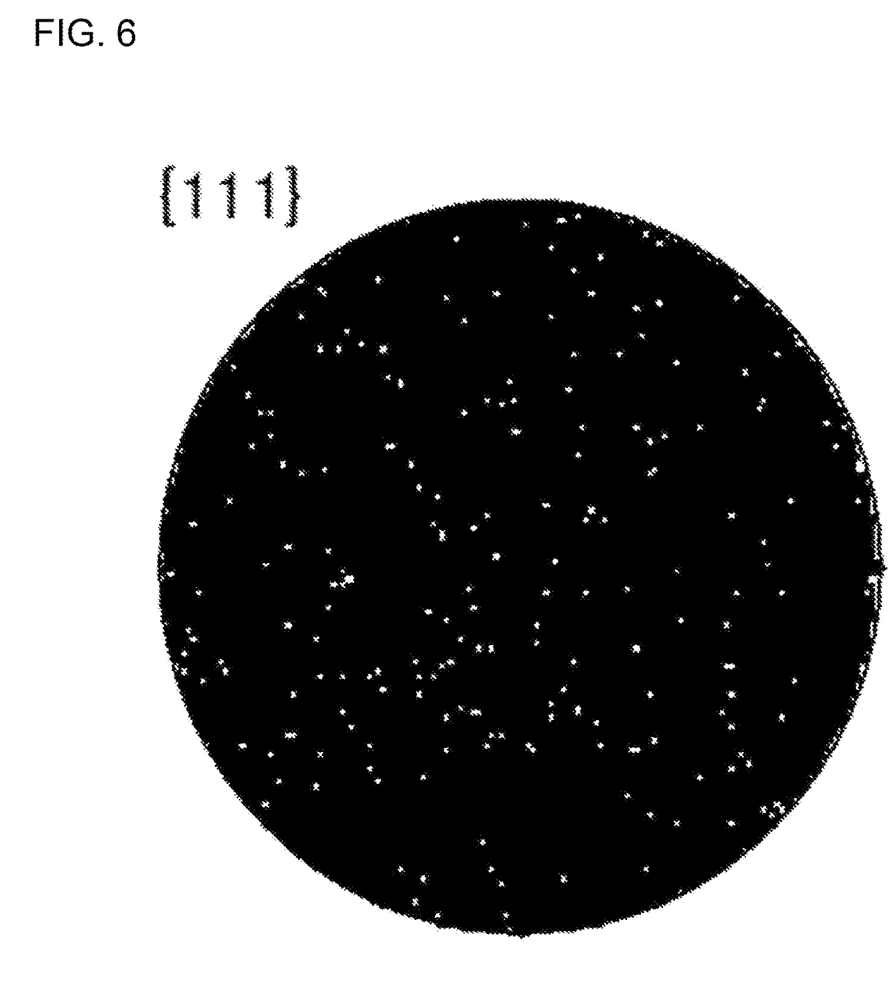
FIG. 6 is a pole figure showing the characteristics of a film included in a component for a plasma processing apparatus according to a comparative example.

FIGS. 2 to 4 are polar figures showing the characteristics of the film included in the component for a plasma processing apparatus according to one or more embodiments of the present disclosure. Each figure shows the measurement results of the film 3 on the substrate 2 formed with a sputtering apparatus (described later) using electron backscatter diffraction (EBSD). FIG. 2 shows the characteristics of the film formed at the center of a chamber in the sputtering apparatus. FIG. 4 shows the characteristics of the film formed at the periphery of the chamber in the sputtering apparatus. FIG. 3 shows the characteristics of the film formed in an intermediate area between the center and the periphery of the chamber in the sputtering apparatus. FIGS. 5 and 6 are pole figures each showing the characteristics of a film included in a component for a plasma processing apparatus according to comparative examples. FIG. 5 shows the characteristics of a film formed on a substrate by atmospheric pressure plasma spraying (APS) in Comparative Example 1. FIG. 6 shows the characteristics of a film formed on a substrate by suspension plasma spraying (SPS) in Comparative Example 2.

The patterns obtained by measuring the crystal lattice plane in the {111} direction using the EBSD appear in the center and the periphery in the pole figures. The film 3 is a polycrystalline film containing yttrium oxide as a main constituent. In the film 3, more patterns appear in the center as the crystals are aligned more precisely in the {111} directions of the crystal lattice planes included in the polycrystalline film. The crystals contained in the film 3 each are thus aligned more precisely in the {111} direction in the Example than in the Comparative Examples.

TABLE 1

| Deviation angle from {111} direction | Area ratio (%) of oriented yttrium oxide crystal grams | | | | |
|---|---|---|---|---|---|
| | Example | | | Comparative Example 1 | Comparative Example 2 |
| | Center | Intermediate | Periphery area | | |
| ±10° | 96.6 | 99.2 | 98.7 | 5.99 | 6.08 |
| ±5° | 80.5 | 97.7 | 93.3 | 1.39 | 1.45 |

Table 1 shows the area ratio, or the percentage of the observation plane occupied by crystal grains with the deviation angles of ±5° and ±10° from the {111} direction of the crystal lattice plane. The ratio of crystals with the deviation angles of ±5° and ±10° from the {111} direction of the crystal lattice plane is higher in the Example than in Comparative Examples 1 and 2. This reveals that the crystals in the film 3 in the Example are aligned more precisely than the crystals in the Comparative Examples 1 and 2, or in other words, the film 3 has a higher orientation.

The film 3 in the Example has an adhesion strength of 50 MPa or greater. The films in the Comparative Examples have an adhesion strength of about 20 MPa. The film 3 with a higher orientation in the Example thus has higher adhesion strength. The adhesion strength of the film can be measured by the Sebastian method. The film 3 has a sufficient adhesion strength when the area ratio of crystal grains oriented with a deviation angle of ±10° from the {111} direction of the crystal lattice plane is 45% or greater. The film 3 of yttrium oxide, which is highly oriented as described above, is formed on a top surface 2a of the substrate 2 in the component 1 for a plasma processing apparatus to increase the adhesion strength between the film 3 and the substrate 2. The component 1 for a plasma processing apparatus can thus have high resistance to plasma over a long period.

The film 3 may have still higher adhesion strength when the area ratio of crystal grains oriented with a deviation angle of ±10° from the {111} direction of the crystal lattice plane is 80% or greater. More specifically, the film 3 may have still higher adhesion strength when the area ratio of crystal grains oriented with a deviation angle of ±5° from the {111} direction of the crystal lattice plane is 20% or greater.

The film 3 highly oriented in this manner can have still higher adhesion strength between the film 3 and the substrate 2. The component 1 for a plasma processing apparatus can thus have high resistance to plasma over a long period. The area ratio of crystal grains oriented with a deviation angle of ±5° from the {111} direction of the crystal lattice plane may be 54% or greater.

In the Example, $I_{310}/I_{222}$ was 0.12 or less, where $I_{222}$ is a peak intensity of the (222) plane of yttrium oxide, and $I_{310}$ is a peak intensity of the (310) plane of yttrium oxide. This indicates that the film 3 has a very few lattice defects and thus can accommodate the thermal stress generated on the surface when exposed to plasma of a corrosive gas. Without cracks or particles, the component 1 for a plasma processing apparatus can have high resistance to plasma over a long period. The peak intensity $I_{222}$ of the (222) plane and the peak intensity $I_{310}$ of the (310) plane are values measured with an X-ray diffractometer.

The film 3 may have a coefficient of variation of 0.04 or less in thickness. The component 1 for a plasma processing apparatus with the structure according to the embodiment of the present disclosure can be used for a longer period than a component having a coefficient of variation in thickness exceeding the above range.

The coefficient of variation refers to a value resulting from dividing the standard deviation of measurement values by the mean. Referring to the reference numerals in FIG. 1, the measurement values are thicknesses of the film 3 from the top surface 2a to the surface of the film 3 at multiple locations in a cross section perpendicular to the top surface 2a of the substrate 2 on which the film 3 is formed.

The film 3 may have an absolute skewness value of 1 or less in thickness. For the absolute skewness value of 1 or less in thickness, the thickness distribution is normal or is close to normal distribution, and thus reduces locally high residual stress. This can reduce the likelihood of the film 3 separating after repeated exposure to plasma over a long period. More specifically, the film 3 may have a skewness of 0 to 1 inclusive in thickness.

Skewness refers to an indicator (statistic) that shows the degree of skewed distribution from the normal distribution, that is, the symmetry of the distribution. For skewness Sk>0, the tail of the distribution extends to the right. For skewness Sk=0, the distribution is symmetrical. For skewness Sk<0, the tail of the distribution extends to the left.

The skewness in thickness can be obtained using the function SKEW available with Excel (registered trademark, Microsoft Corporation).

The measurement is specifically performed at a refractive index of 1.92 with a spectroscopic interferometer. The measurement is performed at 20 or more locations to avoid uneven measurements across the target observation area having, for example, a length of 50 mm in the lateral and vertical directions.

The component 1 for a plasma processing apparatus according to the embodiment of the present disclosure has a coefficient of variation of 0.04 or less in thickness. The film 3 thus has a maximum height Rz of 6 µm or less in its surface roughness profile. The maximum height Rz in the surface roughness profile of the film 3 can be measured with a laser microscope (VK-9500 or its successor, an ultra-deep color three-dimensional (3D) profile measuring microscope, Keyence Corporation) in accordance with JIS B 0601-2001. The measurement conditions include the magnification of 1000× (eyepiece, 20×; objective, 50×), the measurement mode to be color ultra-depth, the measurement resolution (pitch) in the height direction of 0.05 µm, the optical zoom of 1.0×, the gain of 953, the neutral-density (ND) filter of 0, the measurement range of 278×210 µm, the cutoff value λs of 2.5 µm, and the cutoff value kc of 0.08 mm. In calculating the values, n is set to 5 or greater, and the average of the obtained values is defined as the maximum height Rz in the surface roughness profile of the film 3.

The film 3 in the component 1 for a plasma processing apparatus according to the embodiment of the present disclosure has a thickness of 5 to 200 µm inclusive. The micro Vickers hardness Hmv of the film 3 is 7.5 GPa or greater. The micro Vickers hardness Hmv is measured in accordance with JIS R 1610 (2003). The measurement is performed with an automatic micro hardness testing system AMT-X7FS, Matsuzawa Co., Ltd., with a test load of 0.4903 N (50 gf) for 15 seconds. A sample may be a mirror-finished substrate 2 having a top surface 2a coated with a film 3.

A film 3 with a coefficient of variation of 0.025 or less in thickness allows the component 1 for a plasma processing apparatus to have a longer service life than the film with the same average thickness. This is thus highly cost-effective.

The film 3 may have a surface to be exposed to plasma with an arithmetic mean roughness Ra of 0.01 to 0.1 µm inclusive. The film 3 may have multiple pores, for which a value A resulting from subtracting an average of circular equivalent diameters of the pores from an average of distances between the centroids of neighboring pores is 28 to 48 µm inclusive.

The value A being 28 to 48 µm inclusive indicates fewer, smaller pores being dispersed. The component 1 for a plasma processing apparatus with the above structure thus produces fewer particles inside the pores. In addition, the pores are dispersed enough to prevent microcracks originating from pores nearby from extending, thus causing less particles from extended microcracks.

The arithmetic mean roughness Ra may be measured in accordance with JIS B 0601-2013. More specifically, the arithmetic mean roughness Ra may be measured with a surface roughness measuring instrument (Surfcorder) SE500 (Kosaka Laboratory Ltd.), with the probe radius of 5 µm, the measurement length of 2.5 mm, and the cutoff value of 0.8 mm.

In the component 1 for a plasma processing apparatus according to the embodiment of the present disclosure, the film 3 may have multiple pores constituting 1.5 to 6% inclusive of its total area. The pores constituting 1.5 to 6% inclusive of the total area can prevent extension of any microcracks on the surface exposed to plasma (including a surface newly exposed in response to the film being thinner after plasma exposure), thus allowing the film 3 to have fewer particles resulting from microcracks. The area ratio of pores on the surface exposed to plasma is low, with fewer particles produced inside the pores.

In the component 1 for a plasma processing apparatus according to the embodiment of the present disclosure, the film 3 may have the pores with an average sphericity of 60% or greater. With the sphericity of the pores in this range, residual stress is less likely to accumulate around the pores. The film exposed to plasma is thus less likely to have particles around the pores.

The sphericity of the pores herein refers to the ratio defined by a graphite area method and is defined by the following Formula (1).

$$\text{Sphericity of a pore (\%)} = \frac{\text{actual area of the pore}}{\text{area of the smallest circumscribed circle of the pore}} \times 100 \quad (1)$$

In particular, the average sphericity of the pores may be 62% or greater.

The average of the distances between the centroids of the pores, the average of the circular equivalent diameters of the pores, the area ratio, and the sphericity can be determined in the following manner.

First, the surface of the film 3 is observed with a digital microscope at a magnification of 100×. For example, the observation image captured with a charge-coupled device (CCD) camera across an area of 7.68 mm² (3.2 mm in the lateral length and 2.4 mm in the vertical length) is analyzed, and the average of the distances between the centroids of the pores can be obtained through dispersion measurement with image analysis software A-Zou Kun (ver. 2.52) (registered trademark, Asahi Kasei Engineering Corporation).

Using the same observation image as described above, the average of the circular equivalent diameters of the pores, the area ratio, and the sphericity can be obtained through particle analysis with the image analysis software A-Zou Kun.

The yttrium oxide crystal grains may have a mean grain size of 0.01 to 2.5 μm. The crystal grains with a mean grain size of 0.01 μm or greater has fewer grain boundary triple junctions per unit area. This reduces chipping originating from the grain boundary triple junctions under a high voltage applied in a plasma processing apparatus, and thus causes less abnormal discharge. With the crystal grains with a mean grain size of 2.5 Vim or less, the film 3 has a higher fracture toughness. The film 3 with surface defects exposed to plasma can thus reduce the likelihood of microcracks resulting from such defects and extending.

The mean grain size of yttrium oxide crystal grains can be determined using a band contrast map obtained with the EBSD. More specifically, a band contrast map of the surface of the film 3 (observation target) is obtained with a magnification of 10,000×, a lateral length of 12 μm, and a vertical length of 9 μm. The mean grain size can be obtained by drawing six straight lines of the same length (e.g., 6 μm) radially about a point on the band contrast map, and dividing the sum of the lengths of these six lines by the sum of the number of crystals on these lines.

More specifically, the yttrium oxide crystal grains may have a mean grain size of 0.07 to 2 μm.

The yttrium oxide may have a first peak within the visible light region when measured by a cathodoluminescence method.

Figure 8:
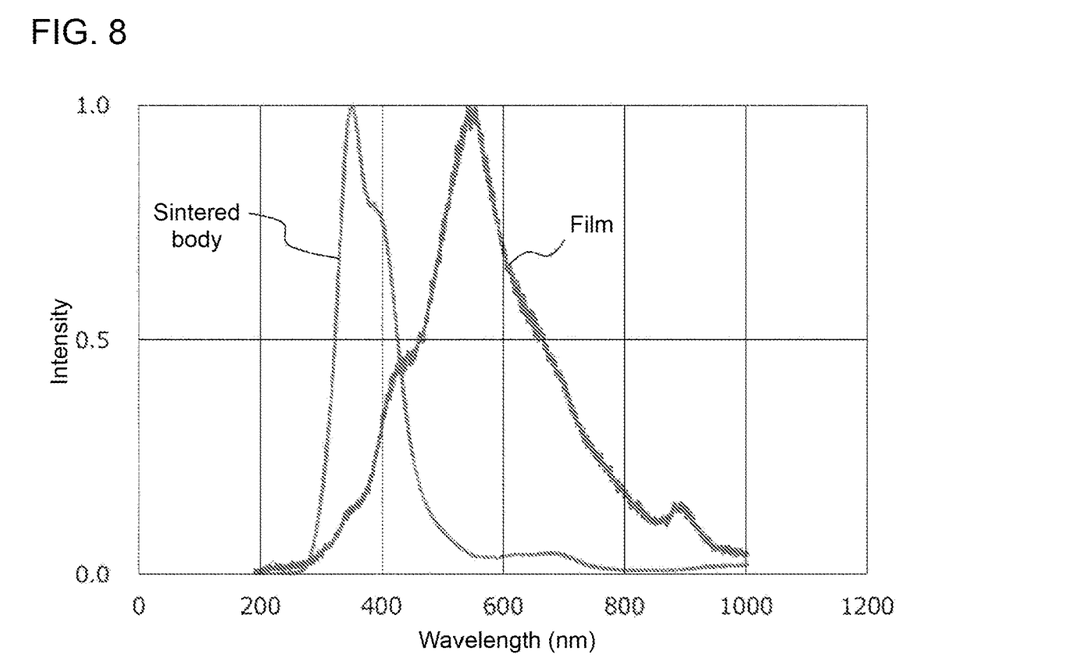
FIG. 8 is a graph showing the emission spectra of a film included in a component for a plasma processing apparatus according to an embodiment of the present disclosure and an yttrium oxide ceramic material (sintered body) having a compositional formula with a fixed ratio ($Y_2O_3$), with the spectra measured by a cathodoluminescence method.

FIG. 8 is a graph showing the emission spectra of a film and an yttrium oxide ceramic material (sintered body) having a compositional formula with a fixed ratio ($Y_2O_3$) included in the component for a plasma processing apparatus according to the embodiment of the present disclosure, with the spectra measured by the cathodoluminescence method.

As shown in FIG. 8, the sintered body has a first peak within the ultraviolet light region, whereas the film has a first peak within the visible light region. The first peak for each of the sintered body and the film refers to a peak with the highest intensity of yttrium oxide. As shown in the figure, the yttrium oxide contained in the film as a main constituent has the first peak at a higher wavelength than the first peak of the yttrium oxide contained in the sintered body as a main constituent. This indicates that the yttrium oxide in the film has a compositional formula with an unfixed ratio, for example, $Y_2O_{3-x}$ ($0<x\leq1$).

The yttrium oxide with the first peak within the visible light region causes, as shown in the above composition formula, oxygen defects. Electrons can easily move through these oxygen defects, thus effectively removing static electricity.

More specifically, the yttrium oxide may have the first peak at 400 to 600 nm.

A method for manufacturing the component 1 for a plasma processing apparatus according to one or more embodiments of the present disclosure will now be described. A method for manufacturing the substrate 2 formed from an aluminum oxide ceramic material will be described first.

An aluminum oxide ($Al_2O_3$) powder A with a mean particle size of 0.4 to 0.6 μm and an aluminum oxide powder B with a mean particle size of about 1.2 to 1.8 μm are prepared. A silicon oxide ($SiO_2$) powder as a Si source and a calcium carbonate ($CaCO_3$) powder as a Ca source are prepared. The silicon oxide powder may be a fine powder with a mean particle size of 0.5 μm or less. To obtain an alumina ceramic material containing Mg, a magnesium hydroxide powder is used. Hereafter, powders other than the aluminum oxide powder A and the aluminum oxide powder B are collectively referred to as first subelement powders.

A predetermined amount of each first subelement powder is weighed out. Then, the aluminum oxide powder A and the aluminum oxide powder B are weighed to have a mass ratio of 40:60 to 60:40 to obtain an aluminum oxide powder mixture. The mixture is prepared to form an alumina ceramic material with an $Al_2O_3$ (converted from Al) content of 99.4% or greater by mass of the total mass (100%) of the elements contained in the alumina ceramic material. To prepare the first subelement powders, the amount of Na in the aluminum oxide powder mixture may be determined first. The amount of Na is then converted to $Na_2O$ to form an aluminum oxide ceramic material. The first subelement powders are weighed to have a ratio of the converted value to a value resulting from converting the elements contained in the first subelement powders (in this example, Si and Ca) to oxides to be 1.1 or less.

With respect to 100 parts in total by mass of the aluminum oxide powder mixture and the first subelement powders, 1 to 1.5 parts by mass of a binder, such as polyvinyl alcohol (PVA), 100 parts by mass of a solvent, and 0.1 to 0.55 parts by mass of a dispersant are placed in a stirrer, and these are then mixed and stirred to obtain slurry.

The slurry is spray-granulated, and the resulting granules are molded into a predetermined shape with, for example, a powder press molding device or a hydrostatic press molding device, and machined as appropriate to obtain a plate-like molded body.

The resulting molded body is then fired at a firing temperature of 1,500 to 1,700° C. inclusive for 4 to 6 hours inclusive. The surface of the resultant body on which the film 3 is to be formed is then polished with diamond abrasive grains having a mean grain size of 1 to 5 μm inclusive and an abrasive disc of tin. This completes the substrate.

Figure 7:
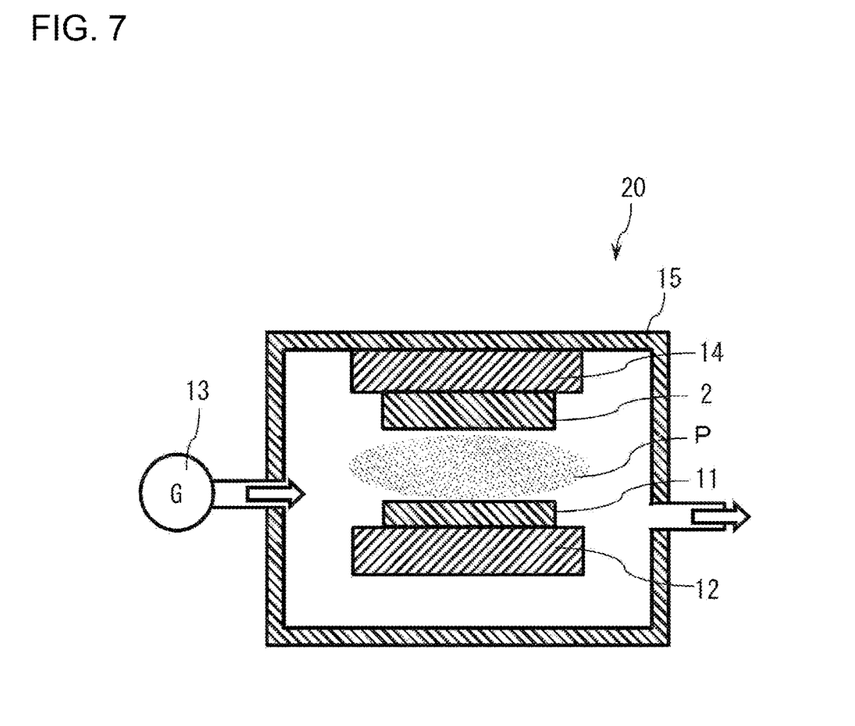
FIG. 7 is a schematic diagram of a sputtering apparatus used to form a component for a plasma processing apparatus according to an embodiment of the present disclosure.

A method for forming the film 3 will now be described with reference to FIG. 7. FIG. 7 is a schematic diagram of a sputtering apparatus 20. The sputtering apparatus 20 includes a chamber 15, a gas supply source 13 connected to the chamber 15, an anode 14 and a cathode 12 located in the chamber 15, and a target 11 connected to the cathode 12.

To form the film 3, the substrate 2 obtained by the method described above is placed on the anode 14 in the chamber 15. The target 11 of metal yttrium with a purity of 4N or greater is placed on the cathode 12, which is on the opposite side of the chamber 15. The chamber 15 is then decompressed using a vacuum pump, and argon and oxygen are supplied as gas G from the gas supply source 13.

The partial pressure of argon is controlled to increase the area ratio of yttrium oxide crystal grains oriented with a deviation angle of ±10° or ±5° from the {111} direction of the crystal lattice plane of yttrium oxide. To achieve an area ratio of 45% or greater of yttrium oxide crystal grains oriented with a deviation angle of ±10° from the {111} direction of the crystal lattice plane of yttrium oxide, the partial pressure of argon is controlled to be 1.4 Pa or less. To achieve an area ratio of 20% or greater of yttrium oxide crystal grains oriented with a deviation angle of ±5° from the {111} direction of the crystal lattice plane of yttrium oxide, the partial pressure is controlled to be 0.005 to 1.2 Pa inclusive.

An electric field is then applied between the anode 14 and the cathode 12 from a power supply to generate plasma P. Sputtering is then performed to form a metal yttrium film on the surface of the substrate 2. A film with a thickness of subnanometers forms per deposition. The metal yttrium film is then oxidized. The deposition and the oxidation of metal yttrium films are alternated to stack the films into the film 3 with a total thickness of 10 to 200 μm inclusive. The resultant component 1 for a plasma processing apparatus according to one or more embodiments of the present disclosure includes the substrate 2 containing aluminum (first element), the film 3 located on the substrate 2 and containing yttrium oxide as a main constituent, and the amorphous section 4 located between the substrate 2 and the film 3 and containing the first element, yttrium, and oxygen.

To obtain a component 1 for a plasma processing apparatus including the amorphous section 4 having the highest content of yttrium by mass, the first oxidation may be performed for a shorter period, for example, for one hour or less.

To obtain a component 1 for a plasma processing apparatus including the amorphous section 4 laminar and having a thickness of 0.0001 to 0.0008 times inclusive the thickness of the film 3, the first oxidation may be performed for 30 minutes or less.

To obtain a component 1 for a plasma processing apparatus including the amorphous section 4 laminar and having a thickness of 1 to 9 nm inclusive, the first oxidation may be performed for 3 minutes or less.

To obtain a component 1 for a plasma processing apparatus containing yttrium oxide crystal grains having a mean grain size of 0.01 to 2.5 μm, the deposition and the oxidization of the metal yttrium films may be adjusted to obtain the film with a thickness of 5 to 500 μm inclusive.

To obtain a component 1 for a plasma processing apparatus containing yttrium oxide having its first peak within the visible light region when measured by the cathodoluminescence method, the pressure of oxygen used in the oxidation may be adjusted to, for example, 0.5 to 5 Pa.

The power supply may supply either radio frequency power or direct current power.

The component 1 for a plasma processing apparatus according to one or more embodiments of the present disclosure obtained with the above manufacturing method can reduce both the number of particles produced inside the pores and the number of particles resulting from extending microcracks.

The component 1 for a plasma processing apparatus according to one or more embodiments of the present disclosure can be used in, for example, a window for transmitting radio frequencies for generating plasma, a shower plate for distributing a gas for generating plasma, and a susceptor for placing a semiconductor wafer in a plasma processing apparatus such as the sputtering apparatus 20, and allows the plasma processing apparatus to be highly durable and reliable.

The present invention may be embodied in various forms without departing from the spirit or the main features of the present invention. The embodiments described above are thus merely illustrative in all respects. The scope of the present invention is defined not by the description given above but by the claims. Any modifications and alterations contained in the claims fall within the scope of the present invention. For example, embodiments derived from combinations of embodiments of the present disclosure are also within the scope of the present invention.

REFERENCE SIGNS LIST 1 component for plasma processing apparatus
2 substrate
3 film
4 amorphous section
20 sputtering apparatus

The invention claimed is:

1. A component for a plasma processing apparatus, comprising:
a substrate containing a first element, the first element being a metal element or a semimetal element;
a film located on the substrate, the film containing yttrium oxide as a main constituent,
wherein the film contains yttrium oxide crystal grains oriented with a deviation angle of ±10° from a {111} direction of a crystal lattice plane of yttrium oxide, and the yttrium oxide crystal grains oriented with the deviation angle of ±10° have an area ratio of 45% or greater; and
an amorphous section between the substrate and film, the amorphous section containing the first element, yttrium, and oxygen, wherein in the amorphous section, yttrium has the highest mass ratio.

2. The component according to claim 1, wherein the film contains yttrium oxide crystal grains oriented with a deviation angle of ±5° from the {111} direction of the crystal lattice plane of yttrium oxide, and the yttrium oxide crystal grains oriented with the deviation angle of ±5° have an area ratio of 20% or greater.

3. The component according to claim 1, wherein $I_{310}/I_{222}$ is 0.12 or less, where $I_{222}$ is a peak intensity of a (222) plane of yttrium oxide, and $I_{310}$ is a peak intensity of a (310) plane of yttrium oxide.

4. The component according to claim 1, wherein the film has a coefficient of variation of 0.04 or less in thickness.

5. The component according to claim 1, wherein the film has an absolute skewness value of 1 or less in thickness.

6. The component according to claim 1, wherein the film has a surface to be exposed to plasma, the surface has an arithmetic mean roughness Ra of 0.01 to 0.1 μm inclusive, the film has a plurality of pores in the surface, and a value resulting from subtracting an average of circular equivalent diameters of the plurality of pores from an average of distances between centroids of neighboring pores of the plurality of pores is 28 to 48 μm inclusive.

7. The component according to claim 1, wherein the yttrium oxide crystal grains have a mean grain size of 0.01 to 2.5 μm.

8. The component according to claim 1, wherein the yttrium oxide has a first peak within a visible light region when measured by a cathodoluminescence method.

9. A plasma processing apparatus, comprising: the component according to claim 1.

* * * * *